United States Patent [19]

Chu et al.

[11] 4,043,296

[45] Aug. 23, 1977

[54] ROLL CONSTRUCTION FOR COATING APPARATUS

[75] Inventors: Simon Long Chu, Dobbs Ferry, N.Y.; Peter Shu, Fogelsville, Pa.; Robert Sharowsky, Hastings-on-Hudson, N.Y.

[73] Assignee: Polychrome Corporation, Yonkers, N.Y.

[21] Appl. No.: 666,859

[22] Filed: Mar. 15, 1976

[51] Int. Cl.$^2$ ............................................... B05C 3/12
[52] U.S. Cl. ................................. 118/419; 118/401; 118/DIG. 2; 29/123
[58] Field of Search .............. 118/401, DIG. 2, 419; 29/110, 123 R

[56] References Cited

U.S. PATENT DOCUMENTS

| | | | |
|---|---|---|---|
| 1,555,389 | 9/1925 | Stevens | 29/123 |
| 1,794,896 | 3/1931 | Hauck | 29/123 |
| 1,981,437 | 11/1934 | Slack | 118/DIG. 2 |
| 2,592,581 | 4/1952 | Lorig | 29/123 X |
| 2,775,954 | 1/1957 | White et al. | 118/DIG. 2 |
| 3,335,026 | 8/1967 | De Geest et al. | 118/DIG. 2 |
| 3,429,741 | 2/1969 | Moriarty | 118/DIG. 2 |
| 3,526,536 | 9/1970 | Spengos et al. | 118/DIG. 2 |

FOREIGN PATENT DOCUMENTS

| | | | |
|---|---|---|---|
| 78,795 | 1/1955 | Denmark | 118/419 |

*Primary Examiner*—James Kee Chi

[57] ABSTRACT

Apparatus for applying a coating of photographically sensitive liquid on one side of a moving aluminum web is constructed with a backing or support roller having stepped portions at each end of an unstepped central portion. The latter is engaged with the anterior surface of the web and is narrower than the web so that coating liquid applied to one surface of the web does not migrate to the edges of the web to contaminate the anterior side thereof. The width of the central portion is great enough so that mechanical stress on the web is not excessive and the undercut height is sufficient to exceed deflection of the web at the edges thereof.

5 Claims, 2 Drawing Figures

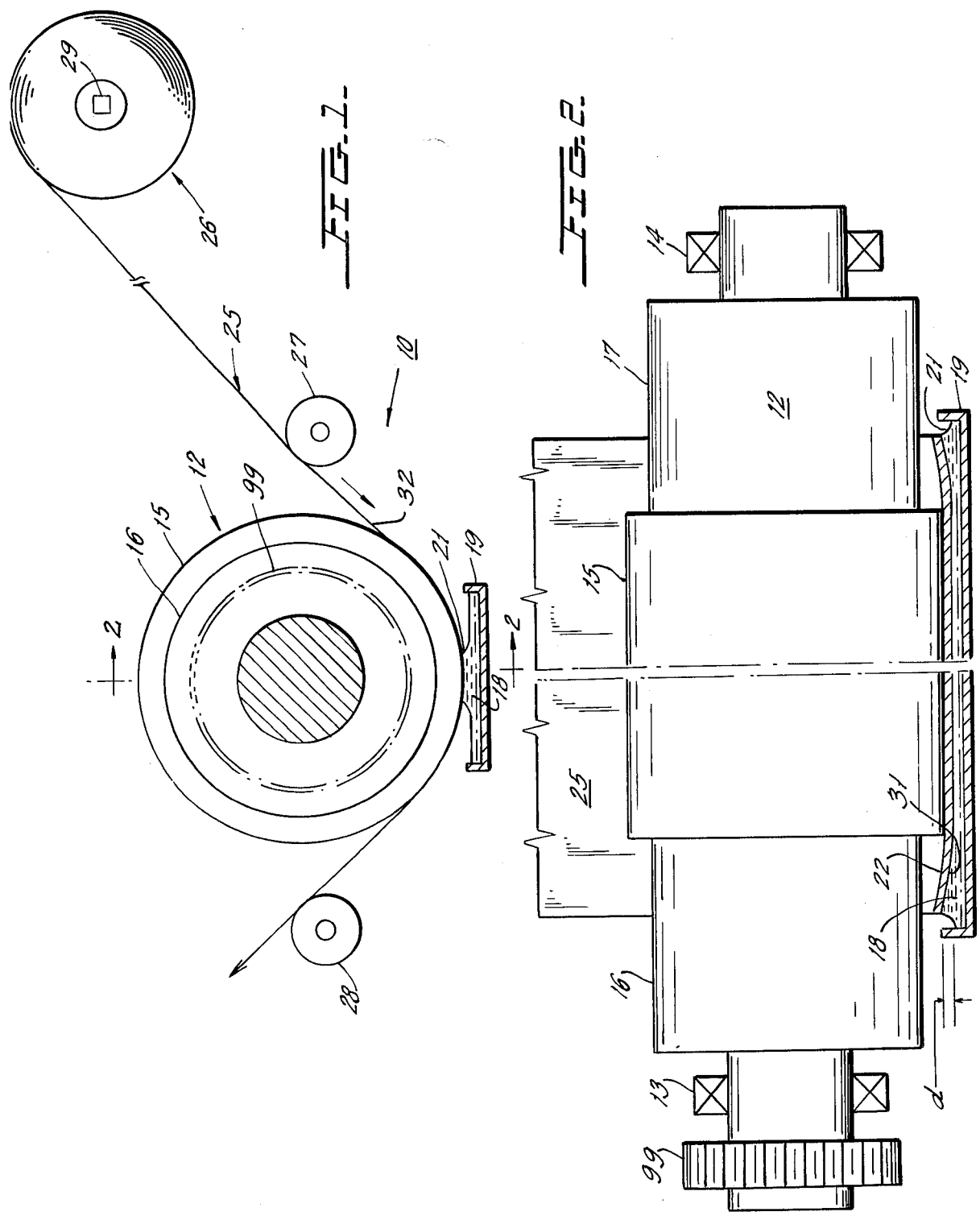

ROLL CONSTRUCTION FOR COATING APPARATUS

This invention relates to roller-type apparatus employed for applying a coating on one surface of a moving web without contaminating the anterior side thereof.

In conventional roller or dip coating methods of applying a thin film or coating to a continuously moving web of metal or other essentially non-porous materials, because the support or backing roller is essentially the same width as the web, the coating material applied to the front of the web often contaminates the anterior surface of the web. That is, since coating material is applied at the web edges, some of this material migrates by capillary action or seepage to the anterior surface of the web. When there is a backing roller of the same width as the web, the cylindrical surface of the backing roller becomes contaminated and in turn contaminates the anterior surface of the web which engages the backing roller. Because of this, prior art backing rollers require constant cleaning and maintenance over very short intervals. Further, when coating the back of the web, contaminants from the front side redesolve causing the back coating solution to become contaminated and the back coating is often specked with front coating material. While coating the face of the web across its entire width, edge seepage from the face to the anterior surface will contaminate any coating present on the anterior surface of the web.

In order to prevent the anterior surface of the web from becoming contaminated with coating material being applied to the face of the web, the instant invention provides a backing or support roller that is undercut at the ends thereof so that the central portion of the roll is narrower than the web to an extent which assures that coating material will not migrate from the edges of the web along its anterior surface. This prevents coating material from migrating along the anterior surface of the web and also prevents coating material from contaminating the backing roller.

The central portion of the backing roller is wide enough so that the web is not stressed to a point where permanent or detrimental deformation thereof takes place. The undercut is deep enough so that deflection of the web along the edges thereof will not bring the edges into engagement with the undercut portions of the backing roller.

Accordingly, a primary object of the instant invention is to provide a novel apparatus for applying a controlled liquid film to the face of a moving web of essentially nonporous material by utilizing a backing roller that is narrower than the web.

Another object is to provide apparatus of this type so constructed that stress on the web being coated is below that which will cause permanent or detrimental deformation of the web.

Still another object is to provide apparatus of this type in which the undercut portions of the backing roll are not engaged by deflected edges of the web.

These objects as well as other objects of this invention shall become readily apparent after reading the following description of the accompanying drawings in which:

FIG. 1 is a side elevation in schematic form of web coating apparatus constructed in accordance with the teaching of the instant invention.

FIG. 2 is a cross-section taken through line 2—2 of FIG. 1 looking in direction of arrows 2—2.

Now referring to the Figures wherein coating apparatus 10 includes backing roller 12 mounted for rotation in fixed bearings 13 and 14. Roller 12 includes central portion 15 which extends for a major portion of the width of roll 12, and undercut portions 16, 17 at opposite ends of central portion 15. Driving power is supplied to roll 12 through gear 99.

The anterior surface 22 of the web 25 is engaged by the roller 12 and brought into sufficiently close proximity to the coating material pool 18 in the reservoir 19 so that a coating meniscus 21 is formed and wets the face or front 31 of web 22. Solution 18 may be photosensitive liquid, such as diazo resin. The amount of coating solution 18 applied to face 31 of the web 25 is controlled by the level of the solution 18 and the size of the reservoir 19. The solution 18 is thus applied across the entire width of the face 32 of the web 25.

Moving web 25 drawn from supply roll 26 passes above idlers 27, 28 in engagement therewith. In the region between idlers 27, 28 web 25 is partially wrapped around central portion 15 of backing roller 12 so that coating material 18 is transferred from the reservoir 19 to front surface 31 of web 25. In a manner well known to the art, a tension force acting on web 25 in a direction parallel to its direction of motion is controlled by brake means 29 which acts on the shaft of supply roll 26.

As best seen in FIG. 2, web 25 is substantially wider than central portion 15 of backing roller 12. Thus, the web edges are unsupported so that the stress on web 25 causes the edges thereof to deflect toward undercut roll sections 16, 17. This deflection is indicated by the reference $d$ in FIG. 2. The edges at each end of central section 15 are slightly slanted or rounded rather than being sharp so as to prevent these edges from cutting web 25.

To determine the maximum width of roller 12 that may be undercut, it is necessary to determine the critical stress for web 25. When this critical stress exceeds the yield strength of the web material the web permanently deforms. This critical stress and the slight shape difference $d$ between the supported and unsupported portions of web 25 are functions of web material, diameter of central portion 15, undercut height or difference in radii between roll portions 15 and 17, web tension as determined by tension service 29, and web thickness. It appears that the angle of wrap of web 25 around central portion 15, and the width of the unsupported edge portions of web 25 are not important in determining web stress. Thus, web stress is approximated by the following formula.

$$P = F/W \times T$$

where:
 $P$ = web stress
 $F$ = total web force or tension provided by brake 29
 $W$ = width of central portion 15
 $T$ = thickness of web 25.

Web stress P should be reasonably below the yield strength of the web material, which is approximately 16,000 psi for aluminum. Thus, with a fixed total web force and fixed web thickness, the less the width of central portion 15 the greater will be the web stress P.

The height of the step between roll portions 15 and 17 is preferably at least ⅛ inch to prevent formation of a menicus between the web 25 and either of the undercut portions 16, 17. In practice the undercut height is between ⅛ inch and ½ inch to about 5% of the diameter of central portion 15.

Edge deflection $d$ is approximated by the following formula.

$$d = P \times D/2M$$

where:
- $d$ = radial distance between the web edge and the periphery of central portion 15
- $D$ = diameter of central portion 15
- $M$ = modulus of elasticity for the web material, which is $10^7$ psi for aluminum.

In a practical example a web of lithographic aluminum 37 inches wide and 0.008 inches thick is partially wrapped around a 10 inch diameter central portion 15 of backing roller 12. The total web force set by brake 29 is 600 pounds and the width of central portion 15 is 26 inches. Thus, the web stress is calculated as:

$$P = 600/26 \times 0.008 = 2880 \text{ psi.}$$

This web stress of 2880 psi is well below the 16,000 psi yield strength of lithographic aluminum.

The slight shape level difference $d$ is calculated for a molulus of elasticity of $10^7$ psi as:

$$d = 2880 \times 10/2 \times 10^7 = 0.0014 \text{ inches.}$$

With the undercut kept to this low value, meniscus coating of undercut portions 16, 17 may easily take place. Therefore, the cutoff height should be made at least ⅛ inch which is considerably greater than the shape level difference $d$, so that the edges of web 25 are spaced from undercut portions 16, 17.

While this invention has been described in connection with means for meniscus coating, it should now be apparent that roller coating, as well as other types of coating means, may be utilized.

This novel invention has been described with reference to a preferred embodiment thereof; many variations and modifications will now become apparent to those skilled in the art. Therefore, this invention is not to be limited by the specific disclosure herein, but only by the appended claims.

What is claimed is:

1. Apparatus for applying a controlled film of coating material on a relatively non-porous web moving lengthwise; said apparatus including a backing roll including a central portion engaged with one surface of the web, and means in the vicinity of said backing roll for applying coating material in liquid form to the other surface of the web by providing a meniscus supported solely by surface tension; said backing roll also including stepped-down portions at each end of said central portion; said central portion being substantially narrower than the web; the radius of said stepped-down portion being less than the radius of the central portion by a step height which is greater than deflection of the web which is the radial distance between those edges of the web that overlie the stepped-down portions of the backing roll and the web section engaged with the central portion; said edges of the web being far enough from said central portion to prevent coating material from migrating from the edges of the web to the backing roll.

2. Apparatus as set forth in claim 1 in which deflection ($d$) of the web is approximated by the formula:

$$d = (P \times D)/2M$$

wherein $D$ is the diameter of the central portion of the backing roll, $M$ is the modulus of elasticity of the web material, and $P$ is stress on the web; said stress ($P$) is approximated by the formula:

$$P = F/(W \times T);$$

wherein $F$ is brake tension acting on the web, $W$ is the width of the central portion of the applicator roll, and $T$ is the thickness of the web; said width ($W$) being sufficient to prevent said brake tension ($F$) from permanently deforming said web.

3. Apparatus as set forth in claim 2 in which the step height is at least one eighth inch.

4. Apparatus as set forth in claim 2 in which the step height is no greater than 5% of the diameter ($D$) of the central portion of the backing roll.

5. Apparatus as set forth in claim 4 in which the step height is at least ⅛ inch.

* * * * *